(12) United States Patent
Hunter et al.

(10) Patent No.: US 7,158,432 B1
(45) Date of Patent: Jan. 2, 2007

(54) MEMORY WITH ROBUST DATA SENSING AND METHOD FOR SENSING DATA

(75) Inventors: Bradford L. Hunter, Austin, TX (US); Shayan Zhang, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/218,135

(22) Filed: Sep. 1, 2005

(51) Int. Cl.
G11C 7/00 (2006.01)
G11C 8/00 (2006.01)

(52) U.S. Cl. .................. 365/207; 365/189.05; 365/203
(58) Field of Classification Search ................ 365/207, 365/189.05, 203, 208
See application file for complete search history.

(56) References Cited

U.S. PATENT DOCUMENTS

| | | | |
|---|---|---|---|
| 4,964,083 A | 10/1990 | Nogle et al. | |
| 6,021,062 A | 2/2000 | Matsuki | |
| 6,111,796 A * | 8/2000 | Chang et al. ............... | 365/196 |
| 6,137,746 A | 10/2000 | Kengeri et al. | |
| 6,198,682 B1 | 3/2001 | Proebsting | |
| 6,292,402 B1 * | 9/2001 | Hanson et al. ......... | 365/189.05 |
| 6,614,696 B1 * | 9/2003 | Kanno et al. ............... | 365/187 |
| 2004/0130926 A1 | 7/2004 | Nakase | |

* cited by examiner

Primary Examiner—Son T. Dinh
(74) Attorney, Agent, or Firm—Larson Newman Abel Polansky & White LLP

(57) ABSTRACT

A memory (100) includes first (116) and second (118) sense amplifiers, a first logic gate (120), a first three-state driver (130), and a latch (180). The first sense amplifier (116) is coupled to a first local data line and has an output terminal for providing a signal indicative of a state of a selected memory cell on the first local data line. The second sense amplifier (118) is coupled to a second local data line and has an output terminal for providing a signal indicative of a state of a selected memory cell on the second local data line. The first three-state driver (130) has a data input terminal coupled to the output terminal of the first logic gate (120), a control input terminal for receiving a first select signal, and an output terminal coupled to a global data line. The latch (180) has an input/output terminal coupled to the global data line (170).

20 Claims, 4 Drawing Sheets

MEMORY WITH ROBUST DATA SENSING AND METHOD FOR SENSING DATA

FIELD OF THE DISCLOSURE

The invention relates generally to memories, and more particularly to sense amplifiers for memories.

BACKGROUND

Integrated circuit memories are organized into one or more arrays each including a matrix of rows and columns, with a memory cell located at each intersection of a row and a column. When accessed during a read cycle, the memory decodes an address to enable one row line. The memory cells on the enabled row line provide their contents onto bit lines, or more commonly, onto differential bit line pairs. Column decoding is used to select a subset of the bit line pairs to couple to one or more differential data line pairs. A sense amplifier coupled to each data line pair detects a logic state of the differential signal and amplifies it. The amplified signal may then be provided to an output terminal of the memory, or further decoding may take place.

The speed at which the decoding takes place together with the sense time determine the overall speed of the memory. To help improve the speed of the memory, the sense time may be reduced. In recent years the differential sensing technique has normally been used to increase the speed of high-speed memories.

At the same time sense amplifiers must correctly sense the state of the selected memory cell. Sense amplifiers for differential data lines, however, may also be susceptible to a problem known as sense line disturb. Sense line disturb occurs when a differential sense amplifier is precharged to a power supply voltage, which causes the sense amplifier to be unable to resolve the logic state for an extended period of time. In worst case conditions, the logic state may also be improperly recognized. For most points in the manufacturing process window, the sense amplifier may be able to recover. However the sense amplifier may eventually fail to resolve the correct logic state of the memory cell. The result is that many integrated circuits will have to be scrapped even though they have been processed within normal manufacturing variances.

Moreover, memory densities have grown over time, generally obeying "Moore's Law". While there may eventually be absolute physical limitations to memory density, they have not yet been encountered. Thus it would be desirable for a sense amplification scheme to be able to accommodate higher densities without re-design.

Therefore what is needed then is a memory with fast sense time, immunity to sense line disturb, and which may be easily scaled to higher densities. A memory according to the present invention provides such benefits, and these and other features and advantages will be made clearer in view of the drawings taken in conjunction with the detailed description.

BRIEF DESCRIPTION OF THE DRAWINGS

The present disclosure may be better understood, and its numerous features and advantages made apparent to those skilled in the art by referencing the accompanying drawing, in which like reference numbers indicate similar or identical items.

DETAILED DESCRIPTION

Figure 1:
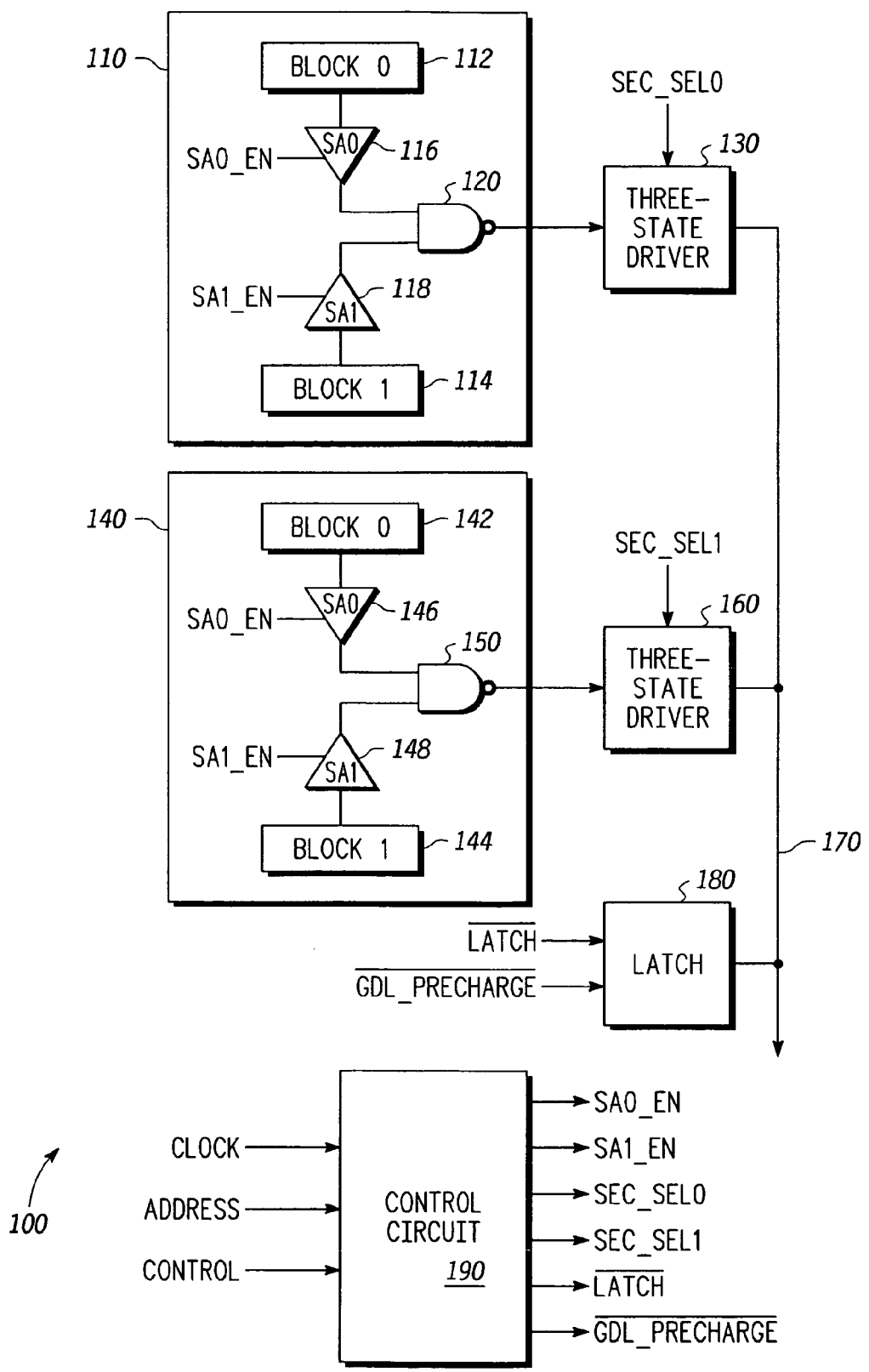
FIG. 1 illustrates in partial block diagram and partial logic diagram form a memory according to the present invention.

In one form a memory includes first and second sense amplifiers, a first logic gate, a first three-state driver, and a latch. The first sense amplifier is coupled to a first local data line and has an output terminal for providing a signal indicative of a state of a selected memory cell on the first local data line. The second sense amplifier is coupled to a second local data line and has an output terminal for providing a signal indicative of a state of a selected memory cell on the second local data line. The first logic gate has a first input terminal coupled to the output terminal of the first sense amplifier, a second input terminal coupled to the output terminal of the second sense amplifier, and an output terminal. The first three-state driver has a data input terminal coupled to the output terminal of the first logic gate, a control input terminal for receiving a first select signal, and an output terminal coupled to a global data line. The latch has an input/output terminal coupled to the global data line.

Such a memory may further include first and second sense amplifier precharge circuits for respectively precharging the first and second local data lines. In one particular embodiment the first and second sense amplifier precharge circuits respectively precharge the first and second local data lines to a logic high level and the first logic gate comprises a NAND gate. The latch may also further have a control input terminal for receiving a latch signal.

In one particular embodiment, the first sense amplifier further has an enable input terminal for receiving a first enable signal, and the second sense amplifier further has an enable input terminal for receiving a second enable signal. In this embodiment, the memory further comprises a control circuit that activates one of the first and second enable signals during a first portion of a memory access cycle, and the latch signal during a second portion of the memory access cycle subsequent to the first portion of the memory access cycle. In this particular embodiment the latch further has a precharge input terminal for receiving a precharge signal, wherein the control circuit activates the precharge signal during a third portion of the memory access cycle prior to the first portion of the memory access cycle.

The memory may also further comprise third and fourth sense amplifiers, a second logic gate, and a second three-state driver. The third sense amplifier is coupled to a third local data line and has an output terminal for providing a signal indicative of a state of a selected memory cell on the third local data line. The fourth sense amplifier is coupled to a fourth local data line and has an output terminal for providing a signal indicative of a state of a selected memory cell on the fourth local data line. The second logic gate has a first input terminal coupled to the output terminal of the third sense amplifier, a second input terminal coupled to the output terminal of the fourth sense amplifier, and an output terminal. The second three-state driver has a data input terminal coupled to the output terminal of the second logic gate, a control input terminal for receiving a first control signal, and an output terminal coupled to the global data line.

In another form a memory includes a first group of sectors. The first group of sectors includes a plurality of sectors, a plurality of three-state drivers, and a logic gate. Each of the plurality of sectors includes a plurality of sense amplifiers coupled to respective local data lines, each sense amplifier having an output terminal for providing a signal indicative of a state of a selected memory cell on a corresponding local data line, and a logic gate having a plurality of input terminals coupled to corresponding output terminals of the plurality of sense amplifiers, and an output terminal. Each of the plurality of three-state drivers has data input terminals coupled to the output terminal of the logic gate of a corresponding one of the plurality of sectors, a control input terminal for receiving a corresponding one of a plurality of select signals, and output terminals coupled to a global data line. The latch has an input/output terminal coupled to the global data line.

In this memory the first group of sectors may further comprise a plurality of sense amplifier precharge circuits for precharging respective ones of the plurality of local data lines. Each sense amplifier precharge circuit may also precharges a respective one of the plurality of local data lines to a logic high level and the first logic gate of each of the plurality of sectors may comprise a NAND gate. The latch may also further have a control input terminal for receiving a latch signal. This memory may also further comprise at least one further group of sectors each having an organization substantially the same as the first group of sectors and a corresponding global data line, and a multiplexer having a plurality of input terminals coupled to corresponding global data lines of the first group of sectors and the at least one further group of sectors, a control input terminal for receiving a group select signal, and an output terminal for providing a data output signal.

In another form a method for sensing data in a memory is provided. The method includes the steps of outputting a voltage on each of a first plurality of local data lines, the voltage representative of a state of a selected memory cell in a corresponding one of a first plurality of blocks; enabling one of a first plurality of sense amplifiers, each one of the first plurality of sense amplifiers coupled to a respective one of the first plurality of local data lines; detecting whether the enabled one of the first plurality of sense amplifiers is driving a predetermined logic level using a first logic gate; driving a voltage on a global data line corresponding to an output of the first logic gate; and latching a voltage on the global data line.

According to this embodiment, the step of detecting may comprise the step of detecting whether the enabled one of the first plurality of sense amplifiers is driving a logic low using a NAND gate. The step of driving may also comprise the step of selectively driving the voltage on the global data line corresponding to an output of the first logic gate in response to a first sector select signal. If so, the method may include the further steps of outputting a voltage on each of a second plurality of local data lines, the voltage representative of a state of a selected memory cell in a corresponding one of a second plurality of blocks; enabling one of a second plurality of sense amplifiers, each one of the second plurality of sense amplifiers coupled to a respective one of the second plurality of local data lines; detecting whether the enabled one of the second plurality of sense amplifiers is driving a predetermined logic level using a second logic gate; and selectively driving a voltage on the global data line corresponding to an output of the second logic gate in response to a second sector select signal.

In one particular embodiment the method may also include the step of precharging each of the first plurality of local data lines to a predetermined logic level before the step of enabling. In this embodiment the method may further include the step of precharging each of the first plurality of bit lines to a logic high, and the step of detecting may also comprise the step of detecting whether the enabled one of the plurality of sense amplifiers is driving a logic low. The method may also further comprise the steps of performing the step of precharging during a first portion of a memory access cycle; performing the step of enabling during a second portion of the memory access cycle subsequent to the first portion; and performing the step of latching during a third portion of the memory access cycle subsequent to the second portion.

In yet another embodiment the step of driving may comprise the step of driving the voltage on the global data line corresponding to the output of the first logic gate using a three state driver that is active when a sector that includes the first plurality of blocks is active.

As used in this Detailed Description and the accompanying claims, unless otherwise expressly defined herein, a word or phrase having a particular meaning to those of ordinary skill in the art shall be given this meaning and such meaning may later be established with reference to a publicly available technical dictionary or textbook. In the absence of such an express definition or particular technical meaning, a word or phrase shall have the meaning or meanings set forth in an accepted American English language dictionary. When words or phrases listed in such a dictionary have multiple definitions, the inventors intend the words or phrases to cover all the definitions that are not inconsistent with at least one embodiment in the Detailed Description and original claims.

Turning now to the drawings, FIG. 1 illustrates in partial block diagram and partial logic diagram form a memory 100 according to the present invention. Memory 100 includes generally a sector 110, a three-state driver 130, a sector 140, a three-state driver 160, a global data line 170, a latch 180, and a control circuit 190.

Sector 110 includes generally a memory block labeled "BLOCK 0" 112, a memory block labeled "BLOCK 1" 114, a sense amplifier labeled "SA0" 116, a sense amplifier labeled "SA1" 118, and a NAND gate 120. Memory blocks 112 and 114 each include one or more arrays of memory cells having multiple rows defined by word lines crossing multiple columns defined by bit lines. Each memory block outputs a voltage on a local data line representative of a state of a memory cell selected by row and column decoding. Such row and column decoding is conventional and will not be described further. Sense amplifier 116 has an input terminal connected to the local data line associated with memory block 112, an enable input terminal for receiving an enable signal labeled "SA0_EN", and an output terminal. Sense amplifier 118 has an input terminal connected to the local data line associated with memory block 114, an enable input terminal for receiving an enable signal labeled "SA1_EN", and an output terminal. NAND gate 120 has a first input terminal connected to the output terminal of sense amplifier 1116, a second input terminal connected to the output terminal of sense amplifier 118, and an output terminal.

Sector 140 is organized the same as sector 110 and includes generally a memory block labeled "BLOCK 0" 142, a memory block labeled "BLOCK 1" 144, a sense amplifier labeled "SA0" 146, a sense amplifier labeled "SA1" 148, and a NAND gate 150. Memory blocks 142 and 144 each include one or more arrays of memory cells having multiple rows defined by word lines crossing multiple columns defined by bit lines. Each memory block outputs a voltage on a local data line representative of a state of a memory cell selected by row and column decoding on a local data line. Sense amplifier 146 has an input terminal connected to the local data line associated with memory block 142, an enable input terminal for receiving enable signal SA0_EN, and an output terminal. Sense amplifier 148 has an input terminal connected to the local data line associated with memory block 144, an enable input terminal for receiving enable signal SA1_EN, and an output terminal. NAND gate 150 has a first input terminal connected to the output terminal of sense amplifier 146, a second input terminal connected to the output terminal of sense amplifier 148, and an output terminal.

Three-state driver 130 has a data input terminal connected to the output terminal of NAND gate 120, a control input terminal for receiving a signal labeled "SEC_SEL0", and an output terminal connected to global data line 170. Three-state driver 160 has a data input terminal connected to the output terminal of NAND gate 150, a control input terminal for receiving a signal labeled "SEC_SEL1", and an output terminal connected to global data line 170. Latch 180 has an input/output terminal connected to global data line 170, and has a first control input terminal for receiving a signal labeled "$\overline{\text{LATCH}}$", and a second control input terminal for receiving a signal labeled "$\overline{\text{GDL\_PRECHARGE}}$".

Control circuit 190 has a first input terminal for receiving a clock signal labeled "CLOCK", a second input terminal for receiving an address signal labeled "ADDRESS", a third input terminal for receiving a control signal labled "CONTROL", and output terminals for providing signals SA0_EN, SA1_EN, SEC_SEL0, SEC_SEL1, $\overline{\text{LATCH}}$, and $\overline{\text{GDL\_PRECHARGE}}$. Note that as illustrated and described herein, a signal may be represented by one or more physical signal lines. For example, ADDRESS would include at least those address signals used to select either "BLOCK 0" or "BLOCK 1" as well as sector 110 or sector 140.

In basic operation, memory 100 performs conventional row and column decoding to select a memory cell connected to a differential bit line pair. A word line in each of blocks 112 and 114 in sector 110, and blocks 142 and 144 in sector 140 is activated in response to decoding a row address. Each memory cell on the activated word line provides a voltage to a differential bit line pair to which it is connected corresponding to a state of the memory cell. A bit line pair in each of blocks 112 and 114 in sector 110, and blocks 142 and 144 in sector 140 is then coupled to a local data line pair in response to decoding a column address. This portion of the operation of memory 100 is conventional and will not be described further.

The sensing scheme will now be described. Each local data line pair is connected to a corresponding sense amplifier. While FIG. 1 shows the sense amplifiers as having input terminals connected to the local data lines and separate output terminals connected to the corresponding NAND gate inputs for simplicity, they actually have input/output terminals connected to the local data lines themselves. This feature will be described more fully with respect to FIG. 2 below. Note that in an alternate embodiment, the sense amplifiers could actually have output terminals separate from the local data lines.

The sense amplifier inputs on the local data line pair are first precharged to a logic high voltage. Then an extra level of address decoding is used to select a corresponding one of sense amplifiers 116 and 118 in sector 110, and a corresponding one of sense amplifiers 142 and 144 in sector 140, in response to signals SA0_EN and SA1_EN. The enabled sense amplifier then provides a single-ended output signal corresponding to the sensed differential voltage. If there is a positive voltage developed between a first local data line and a second local data line in the local data line pair, then the corresponding sense amplifier amplifies the small differential voltage to a large voltage and provides a logic low signal on its output (the complement local data line). A sense amplifier that is not enabled does not affect the precharged voltage, and the small differential voltage is not large enough to lower the output local data line to a logic low. Thus, one input of NAND gate 120 in sector 110 and one input of NAND gate 150 in sector 140 will be recognized as a logic high, while the other input will be recognized at a logic state corresponding to the selected memory cell.

NAND gates 120 and 150 are respectively connected to three-state drivers 130 and 160. Three-state drivers 130 and 160 are respectively enabled by signals SEC_SEL0 and SEC_SEL1, which are activated in response to another level of address decoding. Thus one three-state driver will drive a voltage on global data line 170 corresponding to a logic level of the memory cell in the selected block, and the other one will be isolated from global data line 170.

Note that in another embodiment, the local data lines could be precharged low instead of high. In this embodiment, NAND gates 120 and 150 would be replaced by OR gates.

Latch 180 provides an additional level of sensing and latching in preparation for final output. Like the local data lines, global data line 170 is precharged and latch 180 includes a precharge circuit for this purpose, which will be described more fully with respect to FIG. 2 below.

Control circuit 190 receives CLOCK, ADDRESS, and CONTROL signals and provides the various select signals described so far (as well as others not shown in FIG. 1), including SA0_EN, SA1_EN, SEC_SEL0, SEC_SEL1, $\overline{\text{LATCH}}$, and $\overline{\text{GDL\_PRECHARGE}}$. Memory 100 is a synchronous memory and control circuit 190 provides various control signals in response to the CLOCK signal. The timing of the various precharge and sensing events will be described more fully with respect to FIGS. 4 and 5 below.

Memory 100 has extremely fast sensing while at the same time guarding against sense line disturb. Sensing is fast because the logic gate and three-state driver are highly skewed in the low evaluation direction, i.e. reading a logic low level. Thus the switchpoint of logic gates like NAND gate 120 are set to be higher than that of a nominal logic gate (i.e., one with a mid-supply switchpoint), and the switchpoints of three-state drivers like three-state driver 130 are set to be lower than that of a nominal logic gate. The local data lines and global data line are precharged to take advantage of this skewed evaluation edge. Immunity from sense line disturb is achieved by the fact that the logic gate and driver are fully static, compared to prior art dynamic sensing schemes. Thus after a sense line disturb, however severe, the desired high logic level can be fully restored on the global data line. In addition, the sensing scheme is expandable in multiple dimensions, making memory 100 easily expandable to higher densities. These advantages will now be described more fully with respect to FIGS. 2–6 below.

Figure 2:
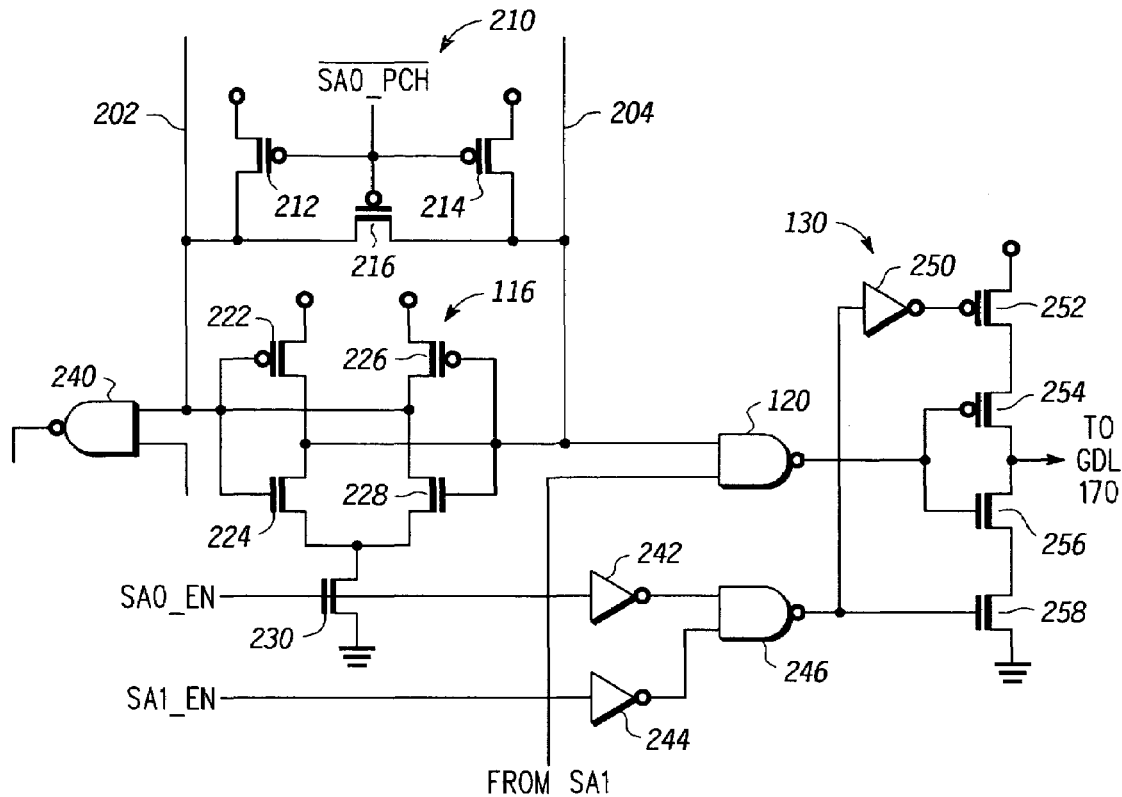
FIG. 2 illustrates in partial logic diagram and partial schematic form a portion of the memory of FIG. 1.

FIG. 2 illustrates in partial logic diagram and partial schematic form a portion 200 of memory 100 of FIG. 1. Portion 200 includes sense amplifier 116 shown in greater detail, NAND gate 120, three-state driver 130 also shown in greater detail, a sense amplifier precharge circuit 210, a NAND gate 240, inverters 242 and 244, and a NAND gate 246.

Sense amplifier 116 includes a P-channel metal-oxide-semiconductor (MOS) transistor 222, an N-channel MOS transistor 224, a P-channel transistor 226, an N-channel transistor 228, and an N-channel transistor 230. Transistor 222 has a source connected to a positive power supply voltage terminal labeled "$V_{DD}$", a gate connected to a first local data line 202 of the differential pair, and a drain. $V_{DD}$ is a more-positive power supply voltage terminal having a nominal voltage of about 1.8 volts, but could be other suitable values appropriate to the transistor technology involved. Transistor 224 has a drain connected to the drain of transistor 222, a gate connected to local data line 202, and a source. Transistor 226 has a source connected to $V_{DD}$, a gate connected to a second local data line 204 of the differential pair and to the drains of transistors 222 and 224, and a drain connected to the gates of transistors 222 and 224. Transistor 228 has a drain connected to the drain of transistor 226 and to the gates of transistors 222 and 224, a gate connected to local data line 204 and to the drains of transistors 222 and 224, and a source connected to the source of transistor 224. Transistor 230 has a drain connected to the sources of transistors 224 and 228, a gate for receiving signal SA0_EN, and a source connected to a power supply voltage terminal labeled "$V_{SS}$". $V_{SS}$ is a ground power supply voltage terminal having a nominal voltage of about 0 volts.

Sense amplifier precharge circuit 210 includes P-channel MOS transistors 212, 214, and 216. Transistor 212 has a source connected to $V_{DD}$, a gate for receiving a control signal labeled "$\overline{SA0\_PCH}$", and a drain connected to local data line 202. Transistor 214 has a source connected to $V_{DD}$, a gate for receiving control signal $\overline{SA0\_PCH}$, and a drain connected to local data line 204. Transistor 216 has a first source-drain terminal connected to local data line 202, a gate for receiving control signal $\overline{SA0\_PCH}$, and a second source/drain terminal connected to local data line 204.

NAND gate 120 has a first terminal connected to the output terminal of sense amplifier 116 on local data line 204, a second input terminal connected to the output of sense amplifier 118 (not shown in FIG. 2), and an output terminal.

Three-state driver circuit 130 includes an inverter 250, P-channel MOS transistors 252 and 254, and N-channel MOS transistors 256 and 258. Inverter 250 has an input terminal for receiving signal SEC_SEL0, and an output terminal. Transistor 252 has a source connected to $V_{DD}$, a gate connected to the output terminal of inverter 250, and a drain. Transistor 254 has a source connected to the drain of transistor 252, a gate connected to the output terminal of NAND gate 120, and a drain connected to global data line 170. Transistor 256 has a drain connected to the drain of transistor 254, a gate connected to the output terminal of NAND gate 120, and a source. Transistor 258 has a drain connected to the source of transistor 256, a gate for receiving signal SEC_SEL0, and a source connected to $V_{SS}$.

NAND gate 240 has a first terminal connected to local data line 202, a second input terminal connected to a corresponding local data line 202 in block 114, and an unconnected output terminal. Inverter 242 has an input terminal for receiving control signal SA0_EN, and an output terminal. Inverter 244 has an input terminal for receiving control signal SA1_EN, and an output terminal. NAND gate 246 has a first input terminal connected to the output terminal of inverter 242, a second input terminal connected to the output terminal of inverter 244, and an output terminal connected to the input terminal of inverter 250 and to the gate of transistor 258 for providing signal SEC_SEL0 thereto.

During a precharge portion of an access, control circuit 190 activates $\overline{SA0\_PCH}$ at a logic low. Transistors 212 and 214 become conductive, pulling local data lines 202 and 204 to VDD. At the same time, transistor 216 equalizes local data lines 202 and 204 by connecting them together.

During a sensing portion subsequent to the precharge portion, after $\overline{SA0\_PCH}$ has been deactivated, the bit lines start to develop a differential voltage between local data lines 202 and 204. Control circuit 190 activates SA0_EN, causing transistor 230 to become conductive and sense amplifier 116 to become active. Sense amplifier 116 is essentially a pair of cross-coupled CMOS inverters, but memory 100 only uses data line 204 to perform single-ended sensing. Signal SEC_SEL0 is developed from signals SA0_EN and SA1_EN by inverters 242, 244, and NAND gate 246 so as shown only one SA0_EN from sectors 110 and 140 is activated. Alternatively, SA0_EN and SA1_EN could exclude sector select information and signals SEC_SEL0 and SEC_SEL1 could be independent signals. When active, SEC_SEL0 activates sense amplifier 116 by making transistor 258 in the pulldown portion conductive, while making transistor 252 in the pullup portion similarly conductive through inverter 250.

Figure 3:
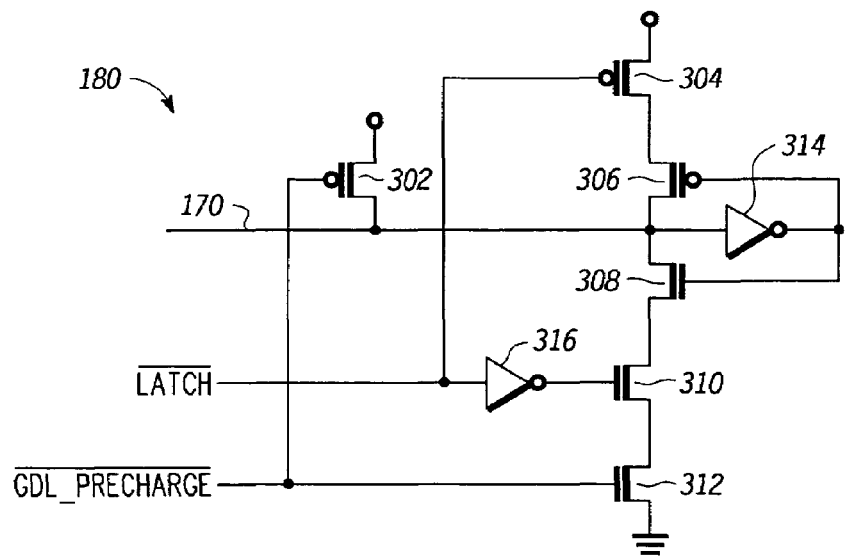
FIG. 3 illustrates in partial logic diagram and partial schematic form the latch of the memory of FIG. 1.

FIG. 3 illustrates in partial logic diagram and partial schematic form latch 180 of memory 100 of FIG. 1. Latch 180 includes P-channel MOS transistors 302, 304, and 306, N-channel MOS transistors 308, 310, and 312, and inverters 314 and 316. Transistor 302 has a source connected to $V_{DD}$, a gate for receiving the control signal $\overline{GDL\_PRECHARGE}$, and a drain connected to global data line 170. Transistor 304 has a source connected to $V_{DD}$, a gate for receiving control signal $\overline{LATCH}$, and a drain. Transistor 306 has a source connected to the drain of transistor 304, a gate, and a source. Transistor 308 has a drain connected to the drain of transistor 306, a gate, and a source. Transistor 310 has a drain connected to the source of transistor 308, a gate, and a source. Transistor 312 has a drain connected to the source of transistor 310, a gate for receiving control signal GDL_PRECHARGE, and a source connected to $V_{SS}$. Inverter 314 has an input terminal connected to the drains of transistors 306 and 308, and an output terminal connected to the gates of transistors 306 and 308. Inverter 316 has an input terminal for receiving control signal $\overline{LATCH}$, and an output terminal connected to the gate of transistor 310.

During a global data line precharge portion, which occurs at the beginning of an access, control circuit 190 deactivates signal $\overline{GDL\_PRECHARGE}$ at a logic low. The logic low makes transistor 302 conductive, raising the voltage on global data line 170 to substantially $V_{DD}$. At the same time, the logic low voltage makes transistor 312 nonconductive, disabling the latch portion. Subsequently, $\overline{GDL\_PRECHARGE}$ goes high, making precharge transistor 302 nonconductive and transistor 312 conductive. However an additional control signal, $\overline{LATCH}$, is required to make the latch portion operative, and when $\overline{LATCH}$ goes low, transistor 304 becomes conductive as well as transistor 310 through inverter 316.

Figure 4:
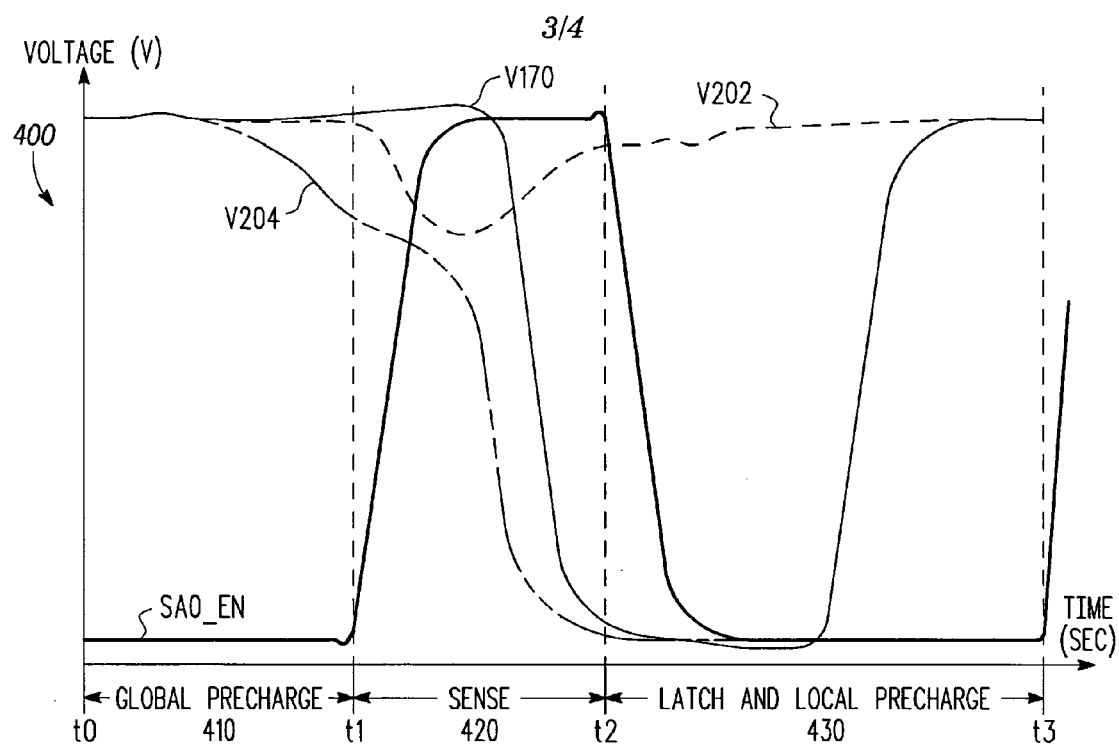
FIG. 4 illustrates a timing diagram of control signals useful in understanding the operation of the memory of FIG. 1.

The timing of various signals will now be explained generally with respect to FIG. 4, which illustrates a timing diagram 400 of control signals useful in understanding the operation of memory 100 of FIG. 1. In timing diagram 400, the horizontal axis represents time whereas the vertical axis represents voltage in volts. FIG. 4 illustrates four signals: the voltage on local data line 202 labeled "$V_{202}$", the voltage on local data line 204 labeled "$V_{204}$", the voltage on global data line 170 labeled "$V_{202}$", and control signal SA0_EN. Four time points, labeled "t0", "t1", "t2", and "t3" are also shown. The time period between t0 and t1 defines a global precharge period 410, the time between t1 and t2 defines a sense period 420, and the time between t2 and t3 defines a latch and local precharge period 430.

During global precharge period 410, SA0_EN is inactive at a logic low. $\overline{\text{GDL\_PRECHARGE}}$ is active at a logic low, and $\overline{\text{LATCH}}$ is inactive at a logic high. V170 is high, but while in global precharge period 410 a memory cell on an activated word line and on a selected pair of bit lines starts to develop a differential voltage between the local data lines. In the example of FIG. 4, this is a positive differential between $V_{202}$ and $V_{204}$. Around time t1, SA0_EN becomes active at a logic high, enabling sense amplifier 116, and $\overline{\text{GDL\_PRECHARGE}}$ becomes inactive at a logic high while $\overline{\text{LATCH}}$ remains inactive at a logic high. Initially since the voltages on local data lines 202 and 204 have been precharged to a logic high, transistors 224 and 226 are both substantially conductive. This conductivity initially reduces both $V_{202}$ and $V_{204}$, but the selected memory cell also acts to pull local data line 204 low. Thus transistor 226 starts to become conductive earlier than transistor 222, and starts to pull local data line 202 high while $V_{204}$ continues to fall. Eventually through the further action of NAND gate 120, three-state driver 130 and latch 180 the differential voltage between local data lines 202 and 204 causes $V_{170}$ to fall, and by the end of sense period 420 $V_{170}$ has fallen to a logic low voltage.

During the subsequent latch and local precharge period 430, $\overline{\text{GDL\_PRECHARGE}}$ remains inactive at a logic high, and $\overline{\text{LATCH}}$ becomes active at a logic low. The sensed voltage is latched on global data line 170, while SA0_EN falls to a logic low and disables sense amplifier 116. At about the same time, signal. $\overline{\text{SA0\_PCH}}$ becomes active at a logic low, and the local data lines are precharged and equalized in preparation for a subsequent access cycle.

Figure 5:
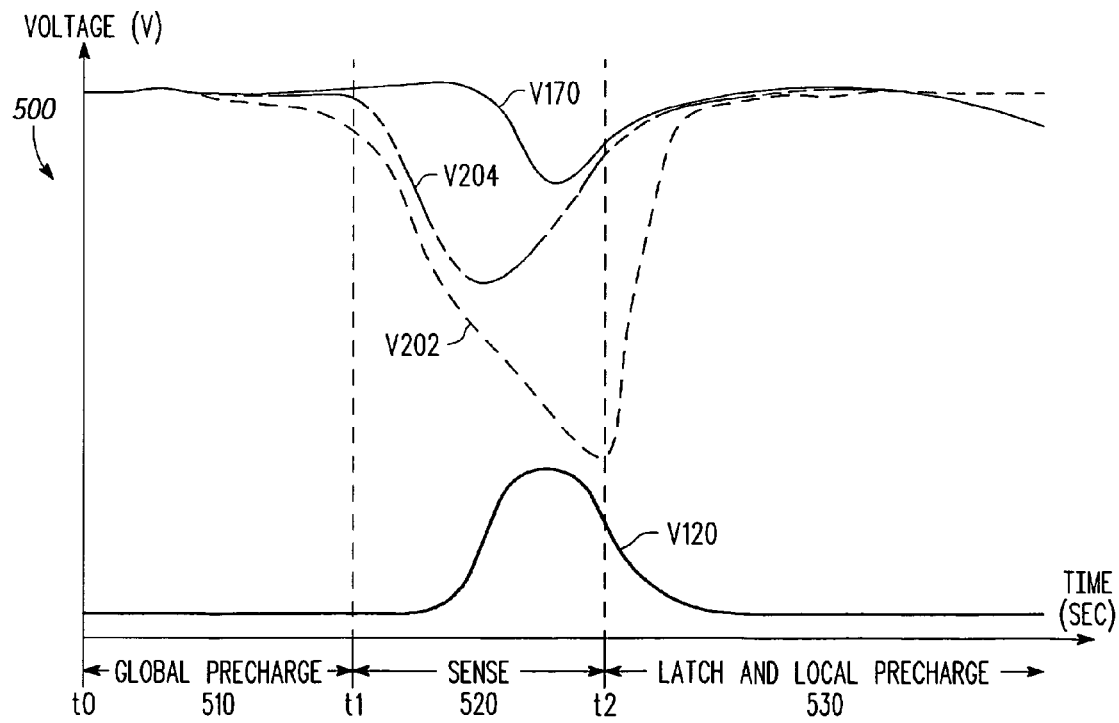
FIG. 5 illustrates a timing diagram of an access cycle of the memory of FIG. 1 showing a worst-case bit line disturb condition.

FIG. 5 illustrates a timing diagram 500 of an access cycle of memory 100 of FIG. 1 showing a worst-case bit line disturb condition. In timing diagram 500, the horizontal axis represents time whereas the vertical axis represents voltage in volts. FIG. 5 illustrates $V_{202}$, $V_{204}$, and $V_{170}$ as above during a global precharge period 510, a sense period 520, and a latch and local precharge period 530 delineated by time points t0, t1, t2, and t3 as in FIG. 4 above. FIG. 5 also shows the voltage at the output of NAND gate 120 designated "V120". In the worst-case condition illustrated in FIG. 5, which generally corresponds to low N-channel transistor thresholds and high P-channel transistor thresholds (in the absolute sense), V202 and V204 both fall significantly before transistors 226 and 222 start to become conductive. V120 starts to rise during the middle part of sense period 520, but then starts to fall. Thus the static nature of NAND gate 120 and three-state driver 130 allows memory 100 to recover from sense line disturb during the worst-case condition, while the high switchpoint of NAND gate 120 and the low switchpoint of three-state driver 130 simultaneously allow memory 100 to provide fast sensing speed.

Figure 6:
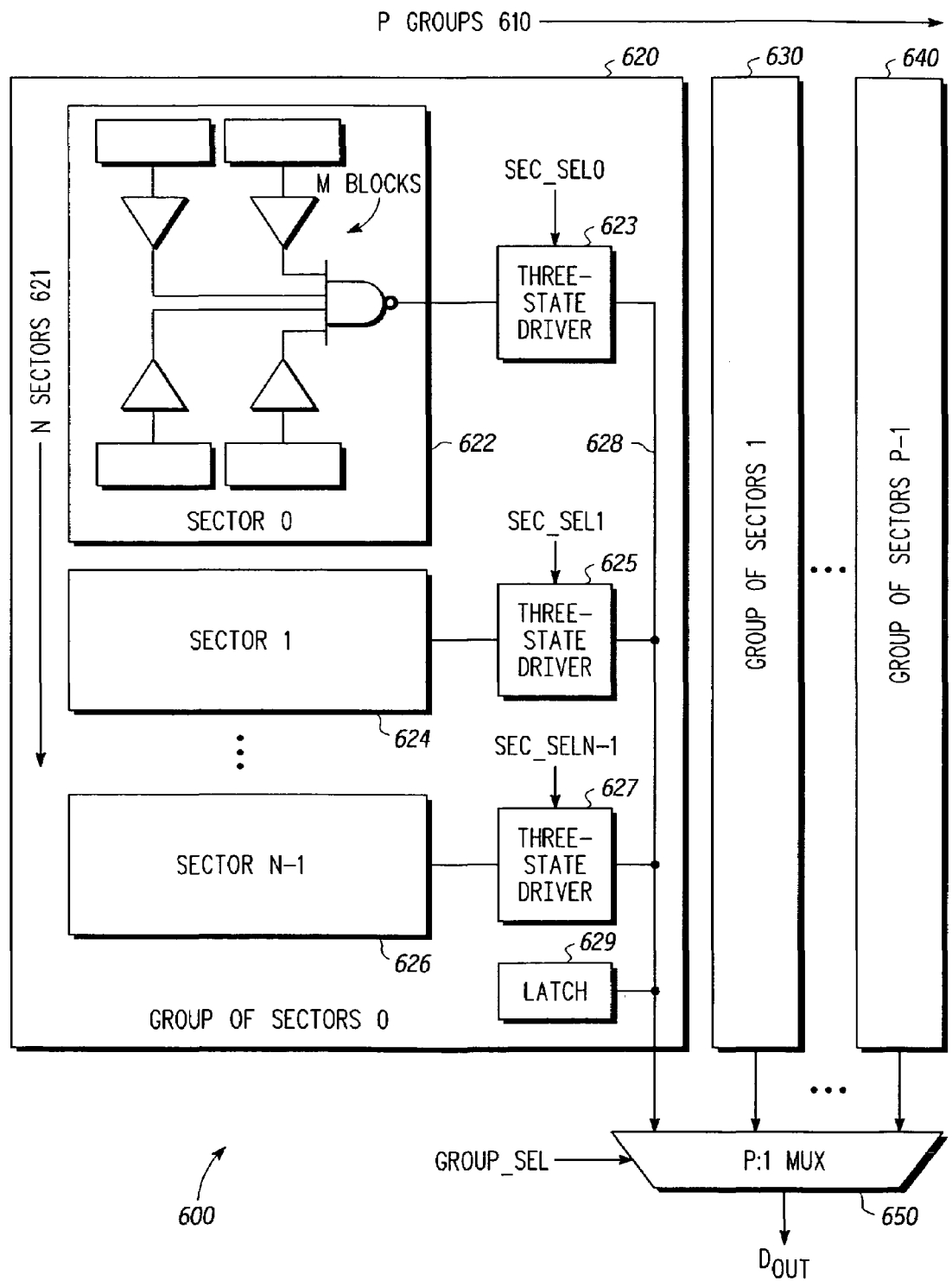
FIG. 6 illustrates a partial block diagram and partial schematic form a memory according to another embodiment of the present invention that illustrates the expandability of a memory using the disclosed sense amplifier technique.

FIG. 6 illustrates a partial block diagram and partial schematic form a memory 600 according to another embodiment of the present invention that illustrates the expandability of a memory using the disclosed sense amplifier technique. Memory 600 has the fast sensing speed and immunity from sense line disturb described with reference to FIGS. 1–5 above, but also has been expanded to a larger density in a modular fashion. Unless otherwise noted elements of memory 600 are the same as corresponding elements of memory 100. FIG. 6 illustrates generally P groups 610 of sectors 620, 630, and 640, respectively labeled "GROUP OF SECTORS 0", "GROUP OF SECTORS 1", and "GROUP OF SECTORS P–1". Each group of sectors has the same organization and FIG. 6 illustrates group 620 is greater detail. Group 620 includes N sectors 621 such as a sector 622 labeled "SECTOR 0", a sector 624 labeled "SECTOR 1", and a sector 626 labeled "SECTOR N–1". Each sector includes M memory blocks each connected by a sense amplifier to an input of a NAND gate. Each sector has an output connected to a corresponding three-state driver and selected by a corresponding signal, including three-state driver 623 corresponding to sector 622 and selected by signal SEC_SEL0, a three-state driver 625 corresponding to sector 624 and selected by signal SEC_SEL1, and a three-state driver 627 corresponding to sector 626 and selected by signal SEC_SELN–1. The outputs of three-state drivers 623, 635, and 627 are connected to a global data line 628, to which is coupled a latch 629.

Groups 630 and 640 are organized the same as group 620. A control circuit similar to control circuit 190 of FIG. 1 also performs an additional level of decoding at the group level to provide an additional control signal labeled "GROUP_SEL". To perform selection at the group level memory 600 includes a multiplexer 650 having P-input terminals including an input terminal connected to global data line 629 of group 620, an input terminal connected to a global data line from group 630, an input terminal connected to a global data line from group 640, a control input terminal for receiving signal GROUP_SEL, and an output terminal for providing a further output signal labeled "$D_{OUT}$".

By using the sense amplifier scheme described with respect to FIGS. 2–5 above, memory 600 can be expanded in an additional dimension. Furthermore each dimension has an arbitrary size. Thus each sector has M-blocks connected to M corresponding inputs of a NAND gate and defining a first dimension, N sectors each connected to a common global data line by a corresponding three-state driver and defining a second dimension, and P groups of sectors each connected to a corresponding input of a P-input multiplexer 650 and defining a third dimension. Thus memory 600 includes M×N×P blocks of memory cells.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A memory comprising:
    a first sense amplifier coupled to a first local data line having an output terminal for providing a signal indicative of a state of a selected memory cell on said first local data line;
    a second sense amplifier coupled to a second local data line having an output terminal for providing a signal indicative of a state of a selected memory cell on said second local data line;
    a first logic gate having a first input terminal coupled to said output terminal of said first sense amplifier, a second input terminal coupled to said output terminal of said second sense amplifier, and an output terminal;
    a first three-state driver having a data input terminal coupled to said output terminal of said first logic gate, a control input terminal for receiving a first select signal, and an output terminal coupled to a global data line; and
    a latch having an input/output terminal coupled to said global data line.

2. The memory of claim 1 further comprising first and second sense amplifier precharge circuits for respectively precharging said first and second local data lines.

3. The memory of claim 2 wherein said first and second sense amplifier precharge circuits respectively precharge said first and second local data lines to a logic high level and said first logic gate comprises a NAND gate.

4. The memory of claim 1 wherein said latch further has a first control input terminal for receiving a latch signal.

5. The memory of claim 4 wherein said first sense amplifier further has an enable input terminal for receiving a first enable signal, and said second sense amplifier further has an enable input terminal for receiving a second enable signal, and wherein the memory further comprises a control circuit that activates one of said first and second enable signals during a first portion of a memory access cycle, and said latch signal during a second portion of said memory access cycle subsequent to said first portion of said memory access cycle.

6. The memory of claim 5 wherein said latch further has a precharge input terminal for receiving a precharge signal, wherein said control circuit activates said precharge signal during a third portion of said memory access cycle prior to said first portion of said memory access cycle.

7. The memory of claim 1 further comprising:
    a third sense amplifier coupled to a third local data line having an output terminal for providing a signal indicative of a state of a selected memory cell on said third local data line;
    a fourth sense amplifier coupled to a fourth local data line having an output terminal for providing a signal indicative of a state of a selected memory cell on said fourth local data line;
    a second logic gate having a first input terminal coupled to said output terminal of said third sense amplifier, a second input terminal coupled to said output terminal of said fourth sense amplifier, and an output terminal; and
    a second three-state driver having a data input terminal coupled to said output terminal of said second logic gate, a control input terminal for receiving a first control signal, and an output terminal coupled to said global data line.

8. A memory comprising:
    a first group of sectors including:
        a plurality of sectors, each sector including a plurality of sense amplifiers coupled to respective local data lines, each sense amplifier having an output terminal for providing a signal indicative of a state of a selected memory cell on a corresponding local data line, and a logic gate having a plurality of input terminals coupled to corresponding output terminals of said plurality of sense amplifiers, and an output terminal;
        a plurality of three-state drivers each having data input terminals coupled to said output terminal of said logic gate of a corresponding one of said plurality of sectors, a control input terminal for receiving a corresponding one of a plurality of select signals, and output terminals coupled to a global data line; and
        a latch having an input/output terminal coupled to said global data line.

9. The memory of claim 8 wherein said first group of sectors further comprises a plurality of sense amplifier precharge circuits for precharging respective ones of said plurality of local data lines.

10. The memory of claim 8 wherein each sense amplifier precharge circuit precharges a respective one of said plurality of local data lines to a logic high level and said first logic gate of each of said plurality of sectors comprises a NAND gate.

11. The memory of claim 8 wherein said latch further has a control input terminal for receiving a latch signal.

12. The memory of claim 8 further comprising:
    at least one further group of sectors each having an organization substantially the same as said first group of sectors and a corresponding global data line; and
    a multiplexer having a plurality of input terminals coupled to corresponding global data lines of said first group of sectors and said at least one further group of sectors, a control input terminal for receiving a group select signal, and an output terminal for providing a data output signal.

13. A method for sensing data in a memory comprising the steps of:
    outputting a voltage on each of a first plurality of local data lines, said voltage representative of a state of a selected memory cell in a corresponding one of a first plurality of blocks;
    enabling one of a first plurality of sense amplifiers, each one of said first plurality of sense amplifiers coupled to a respective one of said first plurality of local data lines;
    detecting whether said enabled one of said first plurality of sense amplifiers is driving a predetermined logic level using a first logic gate;
    driving a voltage on a global data line corresponding to an output of said first logic gate; and
    latching a voltage on said global data line.

14. The method of claim 13 wherein said step of detecting comprises the step of:
    detecting whether said enabled one of said first plurality of sense amplifiers is driving a logic low using a NAND gate.

15. The method of claim 13 wherein said step of driving comprises the step of:
    selectively driving said voltage on said global data line corresponding to an output of said first logic gate in response to a first sector select signal.

16. The method of claim 15 further comprising the step of:
outputting a voltage on each of a second plurality of local data lines, said voltage representative of a state of a selected memory cell in a corresponding one of a second plurality of blocks;
enabling one of a second plurality of sense amplifiers, each one of said second plurality of sense amplifiers coupled to a respective one of said second plurality of local data lines;
detecting whether said enabled one of said second plurality of sense amplifiers is driving a predetermined logic level using a second logic gate; and
selectively driving a voltage on said global data line corresponding to an output of said second logic gate in response to a second sector select signal.

17. The method of claim 13 further comprising the step of:
precharging each of said first plurality of local data lines to a predetermined logic level before said step of enabling.

18. The method of claim 17 further comprising the step of:
precharging each of said first plurality of bit lines to a logic high;
and wherein said step of detecting comprises the step of:
detecting whether said enabled one of said plurality of sense amplifiers is driving a logic low.

19. The method of claim 17 further comprising the step of:
performing said step of precharging during a first portion of a memory access cycle;
performing said step of enabling during a second portion of said memory access cycle subsequent to said first portion; and
performing said step of latching during a third portion of said memory access cycle subsequent to said second portion.

20. The method of claim 13 wherein said step of driving comprises the step of:
driving said voltage on said global data line corresponding to said output of said first logic gate using a three state driver that is active when a sector that includes said first plurality of blocks is active.

* * * * *